United States Patent
Tozawa et al.

(10) Patent No.: US 7,551,496 B2
(45) Date of Patent: Jun. 23, 2009

(54) SIGNAL GENERATOR

(75) Inventors: Seiji Tozawa, Fukuoka (JP); Takashi Shimono, Fukuoka (JP)

(73) Assignee: Sony Corporation, Tokyo (JP)

( * ) Notice: Subject to any disclaimer, the term of this patent is extended or adjusted under 35 U.S.C. 154(b) by 425 days.

(21) Appl. No.: 11/559,128

(22) Filed: Nov. 13, 2006

(65) Prior Publication Data

US 2007/0146523 A1 Jun. 28, 2007

(30) Foreign Application Priority Data

Nov. 14, 2005 (JP) .......................... P2005-328282

(51) Int. Cl.
*G11C 7/06* (2006.01)
(52) U.S. Cl. ............... 365/189.07; 348/312; 348/222.1; 348/252; 348/320; 382/226
(58) Field of Classification Search ............ 365/189.07; 348/312, 252, 222.1, 320; 382/266
See application file for complete search history.

(56) References Cited

U.S. PATENT DOCUMENTS 7,420,606 B2 * 9/2008 Takeda et al. ............... 348/312

2002/0135690 A1 * 9/2002 Tashiro et al. ............... 348/312

FOREIGN PATENT DOCUMENTS

| JP | 01-181384 | 7/1989 |
| JP | 2002-051270 | 2/2002 |

* cited by examiner

*Primary Examiner*—Hoai V Ho
*Assistant Examiner*—Anthan T Tran
(74) *Attorney, Agent, or Firm*—Sonnenschein Nath & Rosenthal LLP (57) ABSTRACT

There is provided a signal generator which includes a main memory which stores at least time data indicating timing when a state change of a timing pulse occurs and space data indicating a state of the timing pulse corresponding to the time data; a counter which counts a clock to be a reference; a first memory which stores predetermined time data in time data stored in the main memory; a comparator which compares an output of the counter with the predetermined time data stored in the first memory and to output a result; a second memory which stores predetermined space data in space data stored in the main memory; and output signal control means which controls the timing pulse to a state of the timing pulse indicated by the space data stored in the second memory on the basis of an output of the comparator.

5 Claims, 9 Drawing Sheets

| ADDRESS | TIME DATA | SPACE DATA | ENDING FLAG |
|---|---|---|---|
| 100 | $T_0$ | 01111100 | 0 |
| 101 | $T_1$ | 00111100 | 0 |
| 102 | $T_2$ | 10111110 | 0 |
| 103 | $T_3$ | 10011110 | 0 |
| ... | ... | ... | ... |
| 109 | $T_{09}$ | 11110011 | 0 |
| 110 | $T_{10}$ | 11110001 | 0 |
| 111 | $T_{11}$ | 11110000 | 1 |

FIG. 3B

| ADDRESS | TIME DATA | SPACE DATA | ENDING FLAG | MODE |
|---|---|---|---|---|
| 100 | $T_0$ | 01111100 | 0 | MODE_A |
| 101 | $T_1$ | 00111100 | 0 | MODE_A |
| 102 | $T_2$ | 10111110 | 0 | MODE_A |
| 103 | $T_3$ | 10011110 | 0 | MODE_A |
| ... | ... | ... | ... | MODE_A |
| 109 | $T_{09}$ | 11110011 | 0 | MODE_A |
| 110 | $T_{10}$ | 11110001 | 0 | MODE_A |
| 111 | $T_{11}$ | 11110000 | 1 | MODE_A |
| 112 | $T_{112}$ | $S_{112}$ | 0 | MODE_B |
| 113 | $T_{113}$ | $S_{113}$ | 0 | MODE_B |
| ... | ... | ... | ... | MODE_B |
| 100+m | $T_{100+m}$ | $S_{100+m}$ | 1 | MODE_B |
| 100+m+1 | $T_{100+m+1}$ | $S_{100+m+1}$ | 0 | MODE_C |
| 100+m+2 | $T_{100+m+2}$ | $S_{100+m+2}$ | 0 | MODE_C |
| ... | ... | ... | ... | MODE_C |
| 100+m+10 | $T_{100+m+10}$ | $S_{100+m+10}$ | 1 | MODE_C |

| ADDRESS | TIME DATA | SPACE DATA | ENDING FLAG |
|---|---|---|---|
| 100 | $T_0$ | 01111000 | 0 |
| 101 | $T_1$ | 00111100 | 0 |
| 102 | $T_2$ | 10011110 | 0 |
| 103 | $T_3$ | 11001110 | 0 |
| 104 | $T_4$ | 11100110 | 0 |
| 105 | $T_5$ | 11110010 | 0 |
| 106 | $T_6$ | 01111010 | 0 |
| 107 | $T_7$ | 00111110 | 0 |
| 108 | $T_8$ | 10011110 | 0 |
| 109 | $T_9$ | 11001110 | 0 |
| 110 | $T_{10}$ | 11100110 | 0 |
| 111 | $T_{11}$ | 11110010 | 1 |

SIGNAL GENERATOR

CROSS REFERENCES TO RELATED APPLICATIONS

The present document contains subject matter related to Japanese Patent Application JP 2005-328282 filed in the Japanese Patent Office on Nov. 14, 2005, the entire contents of which being incorporated herein by reference.

BACKGROUND OF THE INVENTION

1. Field of the Invention

The present invention relates to a signal generator, and more particular to a signal generator that generates a plurality of output signals using a counted value of a counter as a trigger.

2. Description of Related Art

There are generally known a solid state imaging apparatus such as a video camera and a digital still camera that use a solid state imaging device such as a charge coupled device (CCD). Such a solid state imaging apparatus includes a control circuit controlling respective functions of an imaging unit, a signal processing unit, a record processing unit and the like, and is further equipped with a signal generator, a so-called timing generator (TG), which generates a signal to regulate the operation timing of each unit.

Now, it is necessary to drive a vertical CCD and a horizontal CCD at a suitable timing in order to read signal charges from two-dimensionally arranged photodiodes and to transfer the read signal charges using the CCD's. The suitable timing for transferring the signal charges is different depending on respective operation modes, such as a normal photographing mode, in which the resolution of a screen is high, and an autofocus mode, in which a processing speed is regarded as important. In other words, the output signals, i.e., drive timing pulses, that are required for a TG are different according to the respective operation modes. As a result, the drive timing pulses required for the TG sometimes vary in several tens of kinds.

As described above, the TG is required to generate suitable drive timing pulses in accordance with the respective operation modes. In a case of trying to configure such a TG with only logic circuits, the logic circuits to be configured are determined in respect of hardware (circuits, devices, wiring and the like) on the basis of the drive timing pulses to be generated. Consequently, when the drive timing pulses required for the TG are altered, it is obliged to perform another trial manufacture of the logic circuits.

It is noted that the requirements of the miniaturization and the increase of the number of pixels of a CCD have been increasing year by year in the markets of digital still cameras and camcorders, and the drive timing pulses required for the TG have been also diversified.

Moreover, although it is also considerable to start the development of a TG after the determination of the drive timing pulses required for the TG in order to avoid performing such trial manufactures of the logic circuits, it may be difficult to prepare the TG for driving a CCD made on an experimental basis at the time of the shipment of the CCD by such a method.

Moreover, when the structure and the number of pixels of a CCD have been changed, the drive timing pulses required for a TG are also changed generally, and consequently it is not preferable to deal with the changes of the CCD by developing and commercializing a TG on all such occasions because the aforesaid delay of the time of the shipment of the TG to the CCD may be caused and further, the commoditization of a set substrate may be hindered.

Accordingly, there has been proposed a technique of not configuring a TG only with the logic circuits, but storing the data necessary for generating the drive timing pulses required for the TG into a memory built in the TG, for example, in Japanese Patent Application Publication (KOKAI) No. Hei 1-181384 (patent document 1).

Now, by building the memory into the TG to store necessary data into the memory, even if an alteration of the drive timing pulses required for a TG occurs after the TG has been made on an experimental basis, the alteration can be dealt with by altering the data to be stored in a memory. Consequently, the problems mentioned above can be solved. But, because the number of the drive timing pulses to be used for the drive of a solid state imaging device is generally large and the waveforms of the drive timing pulses are complicated, the amount of data to be stored in the memory becomes large.

For dealing with the problem, there has been proposed a technique for achieving the reduction of the amount of data to be stored in a TG, for example, in Japanese Patent Application Publication (KOKAI) No. 2002-51270 (patent document 2). By the technique, as for the drive timing pulses that change with several kinds of correlations, the data indicating a repetition pattern of a certain pulse is stored in a time series data memory. A control value indicating the length of a period from a changing point of a certain drive timing pulse to the next changing point of a drive timing pulse, i.e., logical change unit, is stored in a first memory. The number of the logical changes of pulses during one cycle is stored in a second memory. A desired number of repetition cycles are stored in a third memory. Desired drive timing pulses are obtained by a multiple counting operation using the data in these memories.

Figure 7:
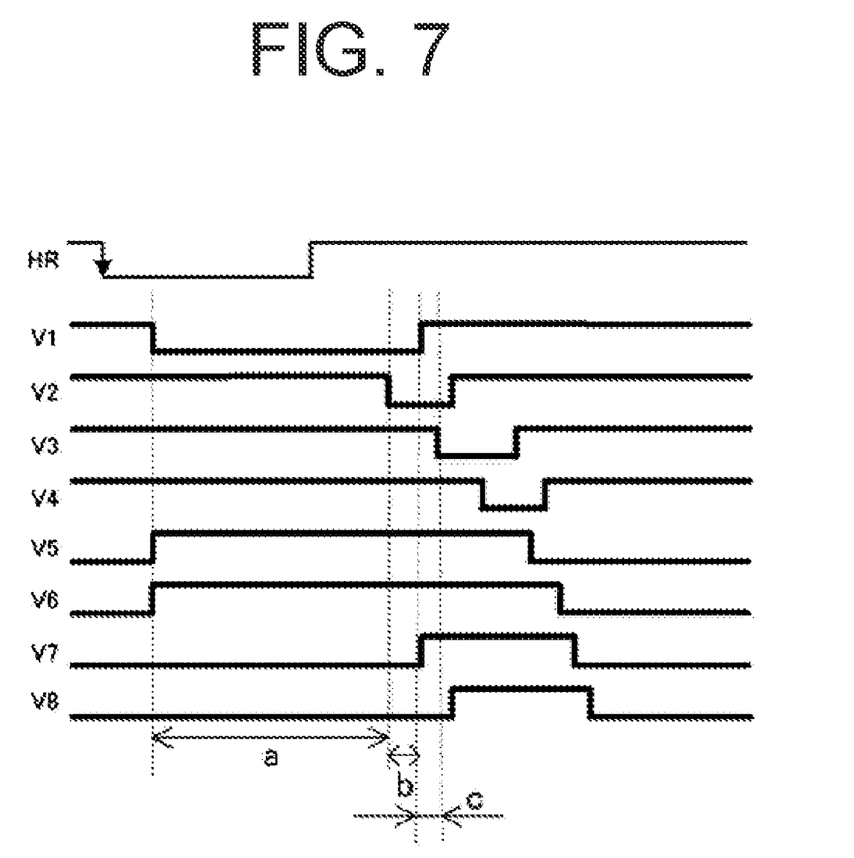
FIG. 7 is a chart showing an example of drive timing pulses in which the length of the period from a changing point of a certain drive timing pulse to the next changing point of a drive timing pulse is not fixed.

However, for example, the drive timing pulses in which the length of a period of a changing point of a certain drive timing pulse to the next changing point of a drive timing pulse is not fixed are shown in FIG. 7. In concrete terms, the drive timing pulses are different from one another in a period denoted by a mark a in FIG. 7, a period denoted by a mark b in FIG. 7 and a period denoted by a mark c in FIG. 7. In this case, the drive timing pulses cannot be divided into logical change units. Consequently, the technique disclosed in the patent document 2 cannot be applied to such drive timing pluses.

In addition, although it is possible to apply the technique of the patent document 2 by dividing the logical change units, in concrete terms, the period denoted by the mark a in FIG. 7, the period denoted by the mark b in FIG. 7, the period denoted by the mark c in FIG. 7 and the like, in pieces to be one unit and by using such a fine unit as a reference, the amount of the data to be stored in a memory becomes very large in such a case.

Figure 8:
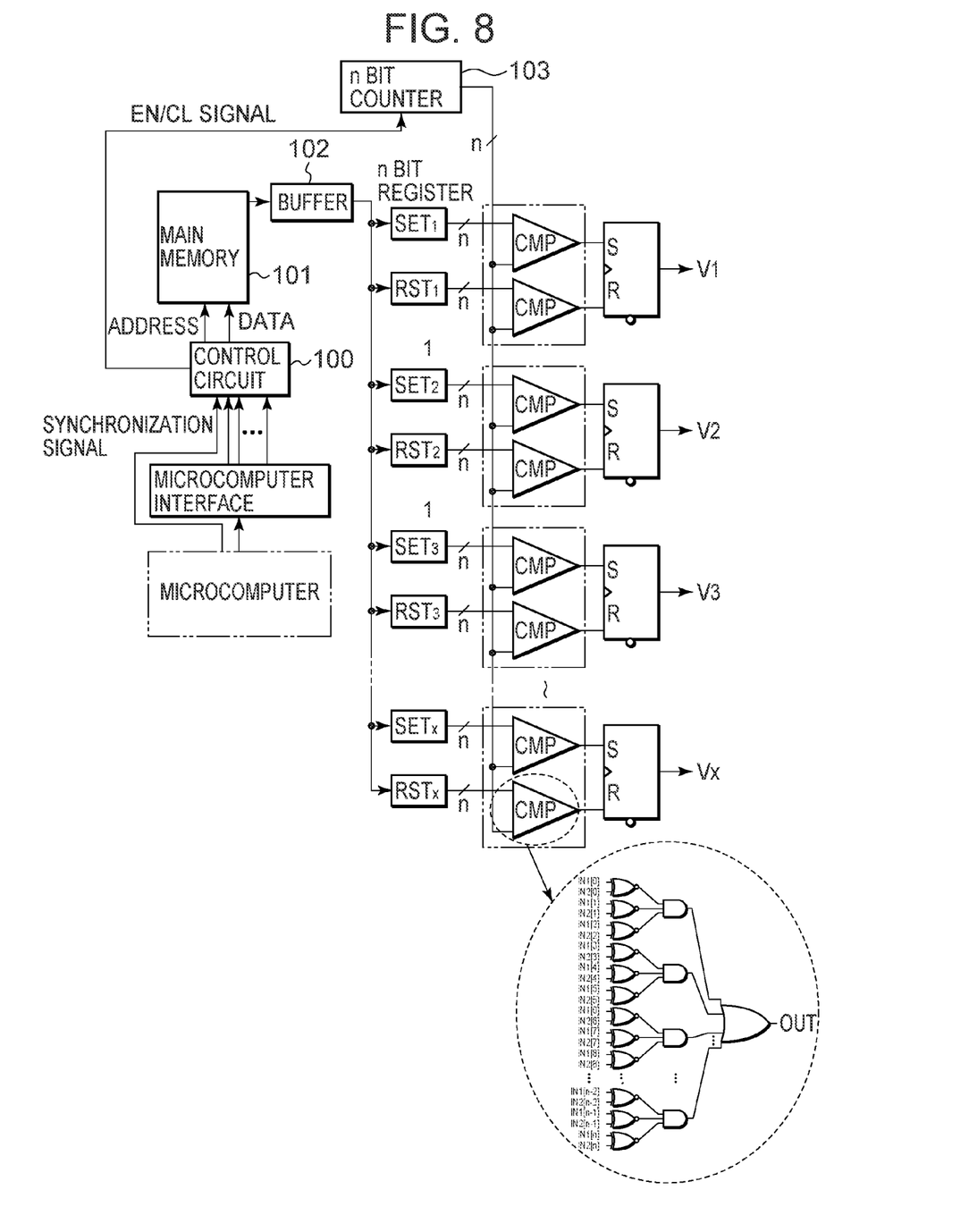
FIG. 8 is a schematic diagram for explaining a related art signal generator.

Accordingly, a TG configured as follows is generally used. That is, as shown in FIG. 8, the TG is provided with n bit registers the number of which is equal to the number of the outputs of drive timing pulses and n bit comparison circuits CMP corresponding to the respective registers. The n bit resisters include n bit set registers SET and n bit reset registers RST. The data of a rising timing of each drive timing pulse of the mode to be an object among the data of a plurality of modes stored in a main memory (e.g. a random access memory (RAM)) 101 is written in a set register through a buffer 102 based on an instruction from a control circuit 100, and the data of the falling timing of each drive timing pulse is written in a reset register through the buffer 102. The rising timing is the timing when the level of the drive timing pulse changes from a low level (L level) to a high level (H level), and the falling timing is the timing when the timing pulse changes from the H level to the L level. Each of the comparison circuit CMP compares the timing written in the register with a counted value of an n bit counter 103. If the counted value of the counter 103 reaches the timing written in the set register, that is, the counted value written in the set register, the TG makes the drive timing pulse rise. If the counted value of the counter 103 reaches the timing written in the reset register, i.e., the counted value written in the reset register, the TG makes the drive timing pulse fall.

It is noted that a microcomputer in FIG. 8 outputs mode data corresponding to an operation and control of an external set, such as camera main body or the like, to a microcomputer interface, and the microcomputer interface outputs the mode data of the TG corresponding to the mode data of the microcomputer to the control circuit 100. Moreover, a synchronization signal in FIG. 8 is directly output from the microcomputer to the control circuit 100 in order to synchronize the other devices in the external set with the TG.

Furthermore concretely speaking, the TG writes the timing, i.e., the counted value of the counter 103, when a drive timing pulse Vt (t=1, 2, ... x) rises into a set register SETt, and writes the timing, i.e., the counted value of the counter 103, when the drive timing pulse Vt falls into a reset register RSTt. Then, the TG compares the counted values written in the set register SETt and the reset register RSTt with the counted value of the counter 103 with the comparison circuits CMP. The TG makes a timing pulse Vt rise at the timing when the counted value of the counter 103 reaches the counted value written in the set register SETt, and makes the timing pulse Vt fall at the timing when the counted value of the counter 103 reaches the counted value written in the reset register RSTt.

Now, it is for making the TG have versatility to write the data indicating the position of a rise or a fall of the drive timing pulse into the n bit register, and a description is given to the respect. In addition, the following description is given on the supposition that the writing of the data into the register is performed in the form of the data of a binary number.

For example, a mode in which the drive timing pulse Vt is made to rise when the counted value of the counter 103 is 10 and the drive timing pulse Vt is made to fall when the counted value of the counter 103 is 50 is referred to as an A mode, and a mode in which the drive timing pulse Vt is made to rise when the counted value of the counter 103 is 100 and the drive timing pulse Vt is made to fall when the counted value of the counter 103 is 500 is referred to as a B mode. In this case, it is possible to deal with the A mode by providing a register of 6 bits because the register can deal with the counted value of the counter 103 up to 64 (=2⁶). But, a register of 9 bits that can deal with the counted value of the counter 103 up to 512 (=2⁹) becomes necessary if it is wanted to deal with the B mode. This fact means that, in a case where the data indicating a rise position or a fall position of a drive timing pulse is written in the register of 9 bits, it is possible to deal with both of the A mode and the B mode.

As described above, in order to make it possible to deal with various modes, and in order to make a TG have versatility, it is preferable that the register in which the data indicating a rise position or a fall position of a drive timing pulse is written has the number of bits (n bit) with an adequate spare in consideration of the number of modes expected in future, for example.

Then, if data (a counted value) is written into the register of n bits, the comparison circuit CMP that compares the counted value written in the register with the counted value of the counter 103 is also required to have n bits.

SUMMARY OF THE INVENTION

However, the circuit configuration which is provided with the register of n bits to each changing point of drive timing pulses and the comparison circuit CMP of n bits to each of the registers, and in which all of the rise positions and fall positions of each of the drive timing pulses are previously written in the registers, i.e., set registers SETt and reset registers RSTt, requires the comparison circuits CMP of n bits by the number of the changing points of the drive timing pulses to be generated. Because each of the comparison circuits CMP is composed of logic circuits, the number of which corresponds to the number of modes (n) as shown in a portion enclosed by a broken line shown in FIG. 8, the circuit scale of the comparison circuits CMP increases as the number of the modes increases. Moreover, a large number of the comparison circuits CMP of n bits are connected with the output circuit of the counter 103, and consequently it is conceivable that the power consumption of the counter 103 increases.

Furthermore, it is necessary that a rise position of a drive timing pulse read from the main memory 101 is written in the set register SETt, and that a fall position of a drive timing pulse read from the main memory 101 is written in the reset register RSTt. Also such data that is written in the registers including the set register SETt and the reset register RSTt becomes necessary by the number of pieces equal to the number of changing points of the drive timing pulses to be generated, and a large number of registers are provided. Consequently, the circuit scale is increased.

Figure 9:
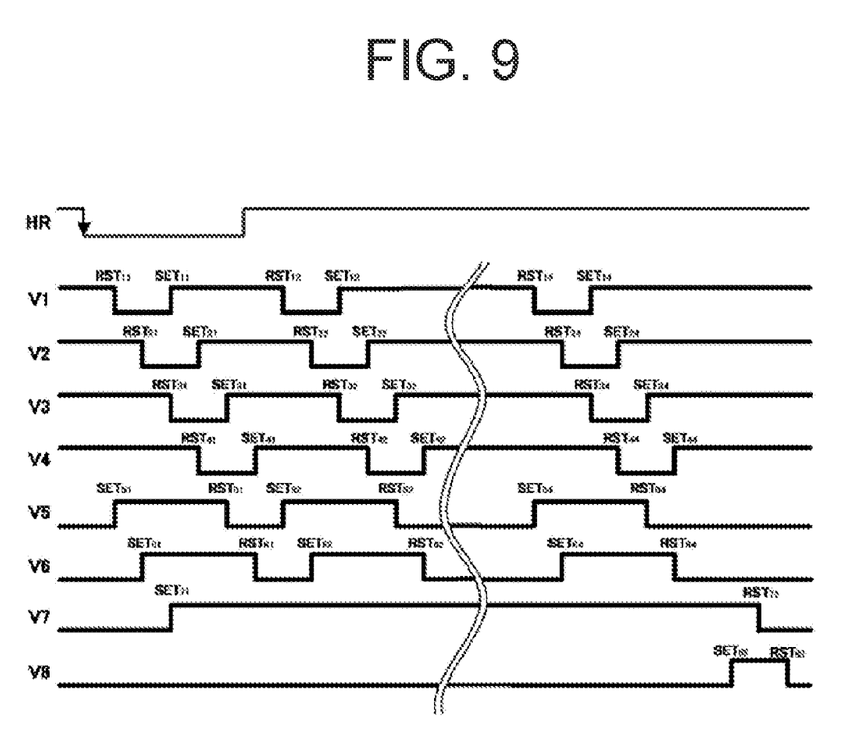
FIG. 9 is a schematic chart for explaining drive timing pulses including a plurality of rise positions and fall positions.

In addition, because each of the drive timing pulses for driving a CCD ordinarily has a plurality of rise positions and fall positions as shown in FIG. 9, it becomes necessary to provide the register of n bits and the comparison circuit CMP of n bits to each of the rise positions and the fall positions in order to realize such drive timing pulses. In concrete terms, in a drive timing pulse V1 for example, it becomes necessary to provide a register of n bits and a comparison circuit COM of n bits to each of the rise positions denoted by marks $SET_{11}$, $SET_{12}$, ... $SET_{14}$ in FIG. 9 and each of the fall positions denoted by marks $RST_{11}$, $RST_{12}$, ... $RST_{14}$ in FIG. 9. Similarly, it becomes necessary to provide the register of n bits and the comparison circuit COM of n bits to each of rise positions and fall positions of each of drive timing pulses V2-V8. Consequently, the still further increase of the circuit scale is brought about.

Moreover, the fact that it is necessary to provide a register of n bits and a comparison circuit CMP of n bits to each of the rise positions and the fall positions of the drive timing pulses means that it is impossible to perform the rises and the falls of the drive timing pulses if the registers of n bits and the comparison circuits CMP of n bits are not provided. In other words, the fact means that the number of setting of state changes (rises and falls) of the drive timing pulses is determined by the numbers of the registers of n bits and the comparison circuits CMP of n bits, and that the drive timing pulses that can be output from the TG is limited.

Consequently, there is a need for providing a signal generator capable of realizing the reduction of a circuit scale and of having the degree of freedom of the signals that can be generated.

A first embodiment of the present invention is a signal generator including a main memory, a counter, a first memory, a comparator, a second memory and output signal control means. The main memory stores at least time data indicating timing when a state change of a timing pulse occurs and space data indicating a state of the timing pulse corresponding to the time data. The counter counts a clock to be a reference. The first memory is connected to the main memory to store predetermined time data in time data stored in the main memory. The comparator is connected to the counter and the first memory to compare an output of the counter with the predetermined time data stored in the first memory and to output a result. The second memory is connected to the main memory to store predetermined space data in space data stored in the main memory. The output signal control means is connected to the comparator and the second memory and controls the timing pulse to a state of the timing pulse indicated by the space data stored in the second memory based on an output of the comparator.

Hereupon, the output signal control means controls the timing pulse (an output signal of the signal generator) to the state of the timing pulse indicated by the space data stored in the second memory on the basis of the output of the comparator comparing for the output (counted value) of the counter counting the clock to be the reference with the predetermined time data stored in the first memory to output the comparison result. The output from the comparator can be obtained based on the counted value of the counter at which the state change of at least one timing pulse among a plurality of timing pulses output from a signal generator by the output signal control means and the timing pulse can be controlled to the state of the timing pulse indicated by the space data stored in the second memory on the basis of the output from the comparator.

Moreover, one bit memory can be used as the second memory by the output signal control means.

In other words, there is no necessity of the comparison to the counted value of the counter of n bits as for the second memory. In a case of receiving the output from the comparator, it is sufficient to store only the information concerning whether the timing pulse is set to the H level, or whether the timing pulse is set to the L level. The case where the timing pulse is set to the H level may include both of the case where the state of the timing pulse of the H level is not changed and the timing pulse is kept to the H level as it is, and the case where the state of the timing pulse of the L level is changed to be the H level. The case where the timing pulse is set to the L level may include both of the case where the state of the timing pulse of the L level is not changed and the timing pulse is kept to the L level as it is, and the case where the state of the timing pulse of the H level is changed to be the L level. Consequently, one bit memory is sufficient for the second memory.

The control of the timing pulse is enabled by storing into the second memory the space data pertaining to the control of the timing pulse performed by using the output that has departed later from the comparator as a trigger after the control of the timing pulse using the output from the comparator that has departed first as a trigger. In addition, the storage to the memory may be performed by overwriting the space data onto the old information stored previously, or by storing the space data after deleting the previous information.

DETAILED DESCRIPTION OF PREFERRED EMBODIMENTS

In the following, an embodiment of the present invention will be described while referring to the attached drawings for the understanding of the present invention.

Figure 1:
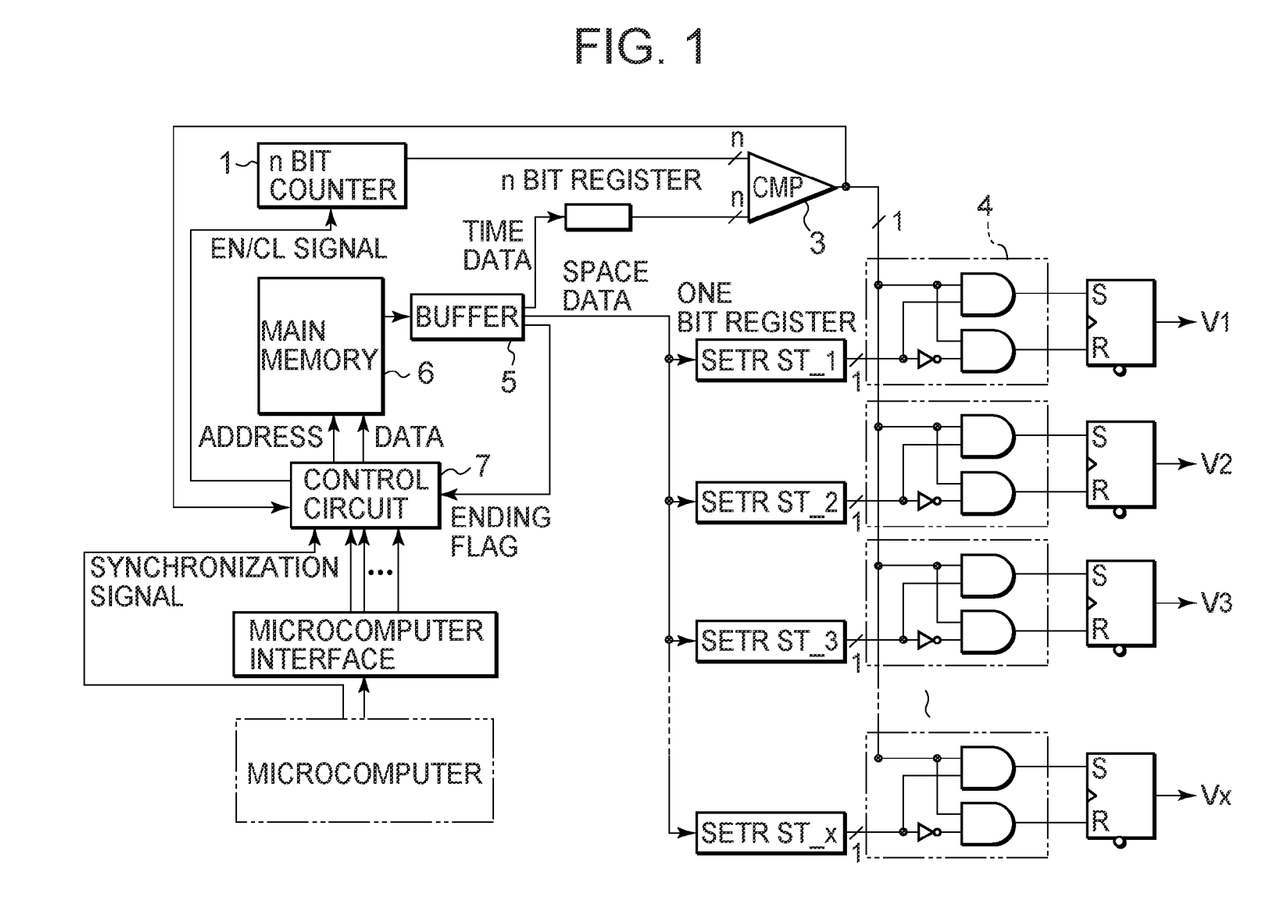
FIG. 1 is a schematic diagram for explaining a TG that is an example of a signal generator to which the present invention is applied.

FIG. 1 is a schematic diagram for explaining a TG that is an example of a signal generator to which the present invention is applied. The TG shown here includes a counter of n bits (hereinafter referred to as an n bit counter) 1, an n bit register 2, a comparator 3, one bit registers (SETRST_1, SETRST_2, . . . SETRST_x), and output signal control means 4. The n bit counter 1 counts a clock to be a reference. The n bit register 2 stores a counted value of the n bit counter 1 at the timing when a state change of at least one drive timing pulse among the drive timing pulses V1-Vx to be output from the TG is produced. The comparator 3 compares the counted value stored in the n bit register 2 (the counted value at which the state change of at least one drive timing pulse among the drive timing pulses to be output from the TG) with the counted value of the n bit counter 1 to output a timing signal when the counted value of the n bit counter 1 has reached the counted value stored in the n bit register 2. The one bit registers is provided for each drive timing pulse to be output from the TG to store the states of the drive timing pulses when the comparator 3 outputs the timing signal. The output signal control means 4 is provided for each of the drive timing pulses to be output from the TG to control the drive timing pulses to the states in which the drive timing pulses are stored in the one bit registers using the timing signal from the comparator 3 as a trigger. Moreover, the n bit register 2 and the one bit registers are connected to a main memory (e.g. a RAM) 6 through a buffer 5, and the main memory 6 is connected to a control circuit 7.

In addition, the n bit register 2 is an example of a first memory, and the one bit registers are an example of a second memory. Moreover, the drive timing pulses are one example of the timing pulse.

First, when the drive timing pulses (output signals) are generated by the TG configured as mentioned above, timing data indicating the timing when a state change of at least one drive timing pulse among a plurality of drive timing pulses to be generated occurs (hereinafter referred to as time data) and data indicating the state of each of the drive timing pulses at that time (hereinafter referred to as space data) become necessary. In concrete terms, as for the time data, the counted value of the n bit counter 1 is necessary, and as for the space data, the information concerning whether each of the drive timing pulses is the H level or the L level becomes necessary correspondingly to the time data. As the data, the H level is indicated by "1", and the L level is supposed to be indicated by "0". In addition, addresses are given to pairs of corresponding time data and space data in the order of the time data, and the data indicating the last of a certain mode (is given to the last address in the case of realizing the mode. For example, the last of the mode is indicated by setting an ending flag bit as the data "1".

Hereupon, the mode is supposed to express a configuration pattern, or combination, of the H level and the L level in a predetermined time width of a timing pulse necessary for giving specific functions such as imaging, a monitoring mode of monitoring an imaging object, of a camera.

Figure 2:
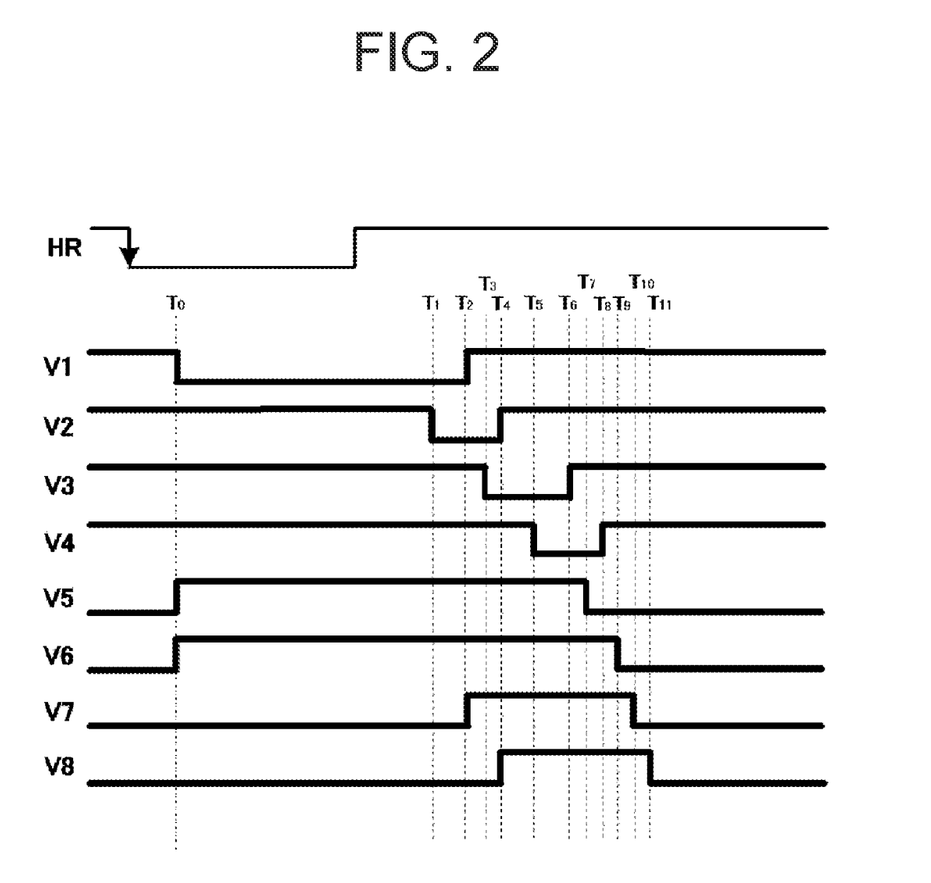
FIG. 2 is a chart showing an example of drive timing pulses to be generated by the example of the signal generator to which the present invention is applied.

For example, in a case where drive timing pulses V1-V8 as shown in FIG. 2 (hereinafter a drive timing pulse Vk (k=1, 2, . . . 8) is simply referred to as "Vk") are generated, T0, T1 . . . T11 become necessary as the time data. Hereupon, a time when a predetermined time (it is not directly related to the present invention) has elapsed from a fall of an HR clock is set as a start reference T0 as an example of the start reference of time. In concrete terms, there are necessary the time data T0 indicating the timing when V1 changes from the H level to the L level, V5 changes from the L level to the H level, and V6 changes from the L level to the H level; the time data T1 indicating the timing when V2 changes from the H level to the L level; the time data T2 indicating the timing when V1 changes from the L level to the H level, and V7 changes from the L level to the H level; the time data T3 indicating the timing when V3 changes from the H level to the L level; the time data T4 indicating the timing when V2 changes from the L level to the H level, and V8 changes from the L level to the H level; the time data T5 indicating the timing when V4 changes from the H level to the L level; the time data T6 indicating the timing when V3 changes from the L level to the H level; the time data T7 indicating the timing when V5 changes from the H level to the L level; the time data T8 indicating the timing when V4 changes from the L level to the H level; the time data T9 indicating the timing when V6 changes from the H level to the L level; the time data T10 indicating the timing when V7 changes from the H level to the L level; and the time data T11 indicating the timing when V8 changes from the H level to the L level.

Moreover, as the space data, the data expressed as follows becomes necessary.

(V1, V2 . . . V8)=(0, 1, 1, 1, 1, 1, 0, 0) at T0,
(V1, V2 . . . V8)=(0, 0, 1, 1, 1, 1, 0, 0) at T1,
(V1, V2 . . . V8)=(1, 0, 1, 1, 1, 1, 1, 0) at T2,
(V1, V2 . . . V8)=(1, 0, 0, 1, 1, 1, 1, 0) at T3,
(V1, V2 . . . V8)=(1, 1, 0, 1, 1, 1, 1, 1) at T4,
(V1, V2 . . . V8)=(1, 1, 0, 0, 1, 1, 1, 1) at T5,
(V1, V2 . . . V8)=(1, 1, 1, 0, 1, 1, 1, 1) at T6,
(V1, V2 . . . V8)=(1, 1, 1, 0, 0, 1, 1, 1) at T7,
(V1, V2 . . . V8)=(1, 1, 1, 1, 0, 1, 1, 1) at T8,
(V1, V2 . . . V8)=(1, 1, 1, 1, 0, 0, 1, 1) at T9,
(V1, V2 . . . V8)=(1, 1, 1, 1, 0, 0, 0, 1) at T10, and
(V1, V2 . . . V8)=(1, 1, 1, 1, 0, 0, 0, 0) at T11.

Then, as the data for realizing the drive timing pulses shown in FIG. 2, the time data T0 and the space data (0, 1, 1, 1, 1, 1, 0, 0) at the time data T0 are stored in a starting address (100), and after that the time data and the space data are similarly stored in continuous addresses. In addition, an ending flag bit is set to the data "1" at the last address (111) (see FIG. 3A).

Figure 3A:
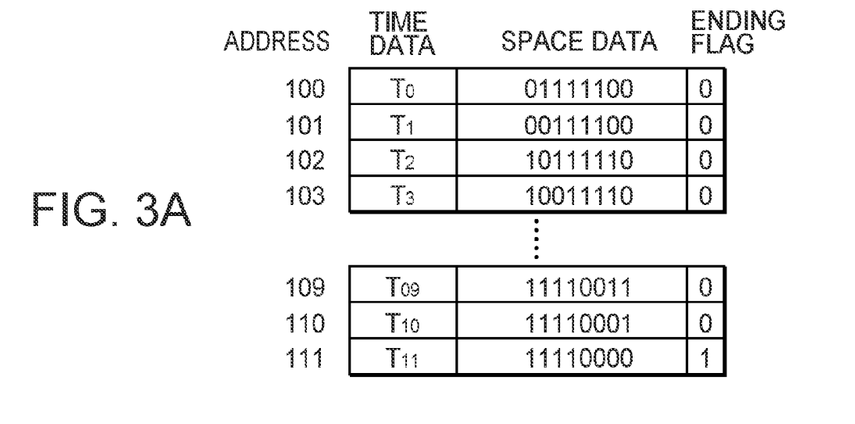
FIGS. 3A and 3B are schematic diagrams for explaining data to be stored in a main memory of the example of the signal generator to which the present invention is applied.
Figure 3B:
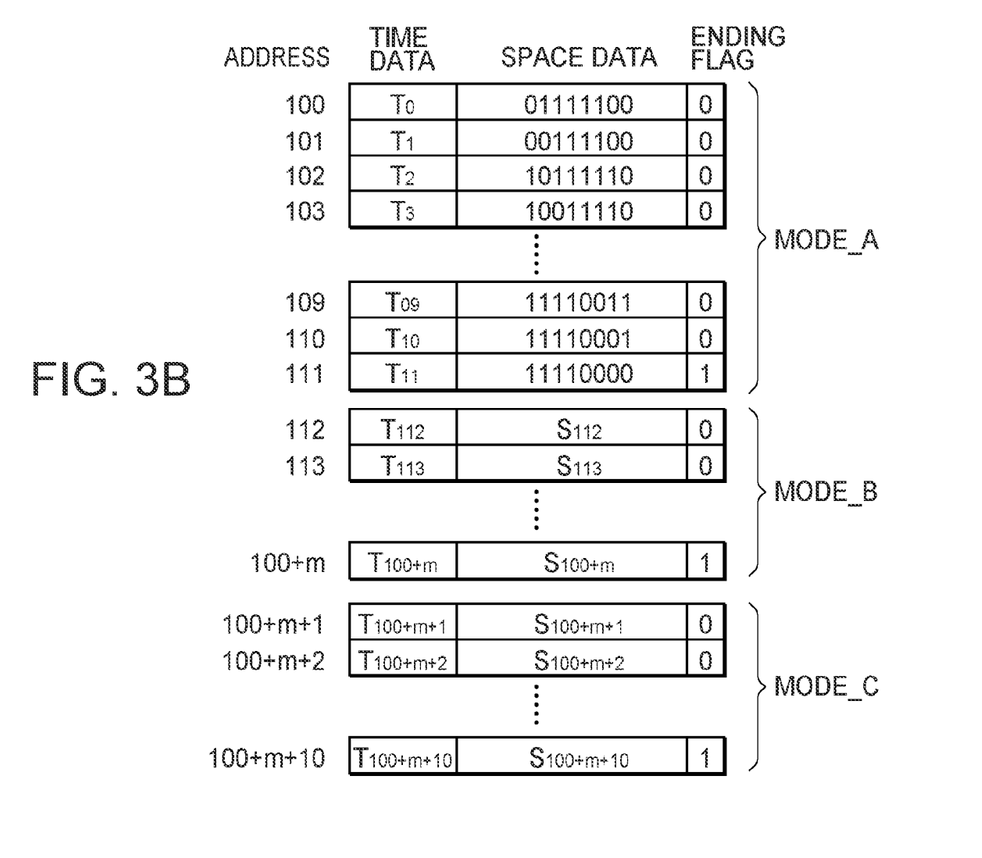

In the way mentioned above, examples of adding addresses to time data T, space data S and an ending flag of each mode wanted to be realized by the TG are shown in FIG. 3B. Such data is stored in the main memory 6 of the TG. Hereupon, the data shown in FIG. 3A is supposed to the data in the mode A.

Figure 4:
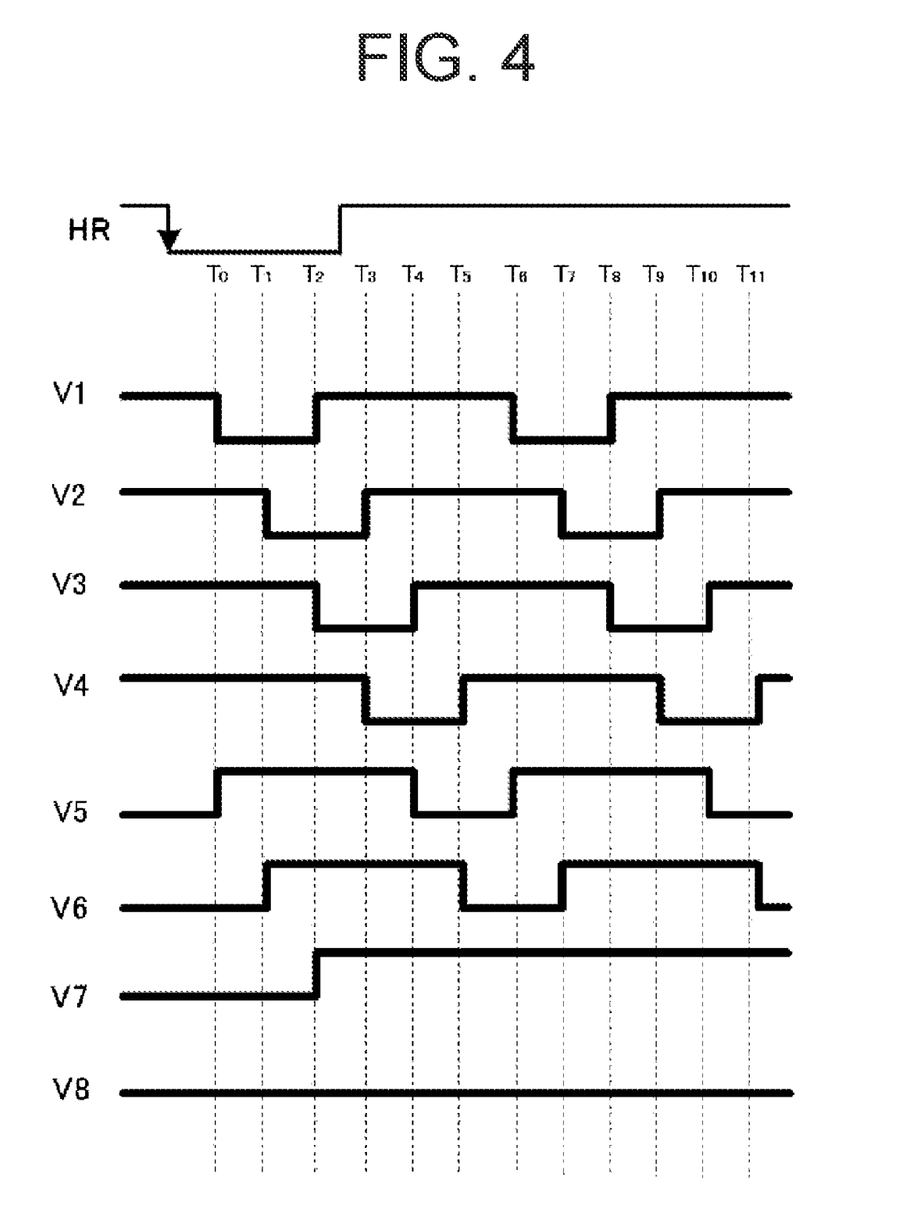
FIG. 4 is a timing chart of drive timing pulses for explaining an application example of the data to be stored in the main memory of the example of the signal generator to which the present invention is applied.
Figure 5:
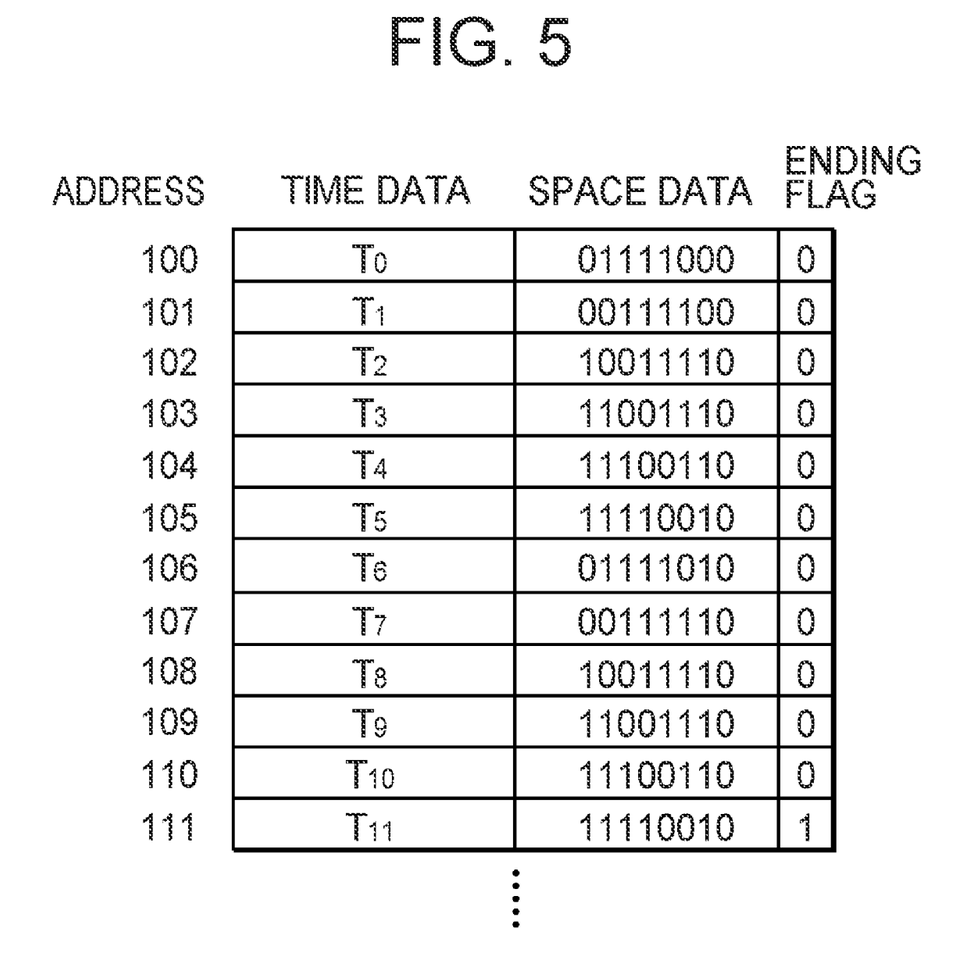
FIG. 5 is a diagram showing an example of data for explaining the application example of the data to be stored in the main memory of the example of the signal generator to which the present invention is applied.
Figure 6:
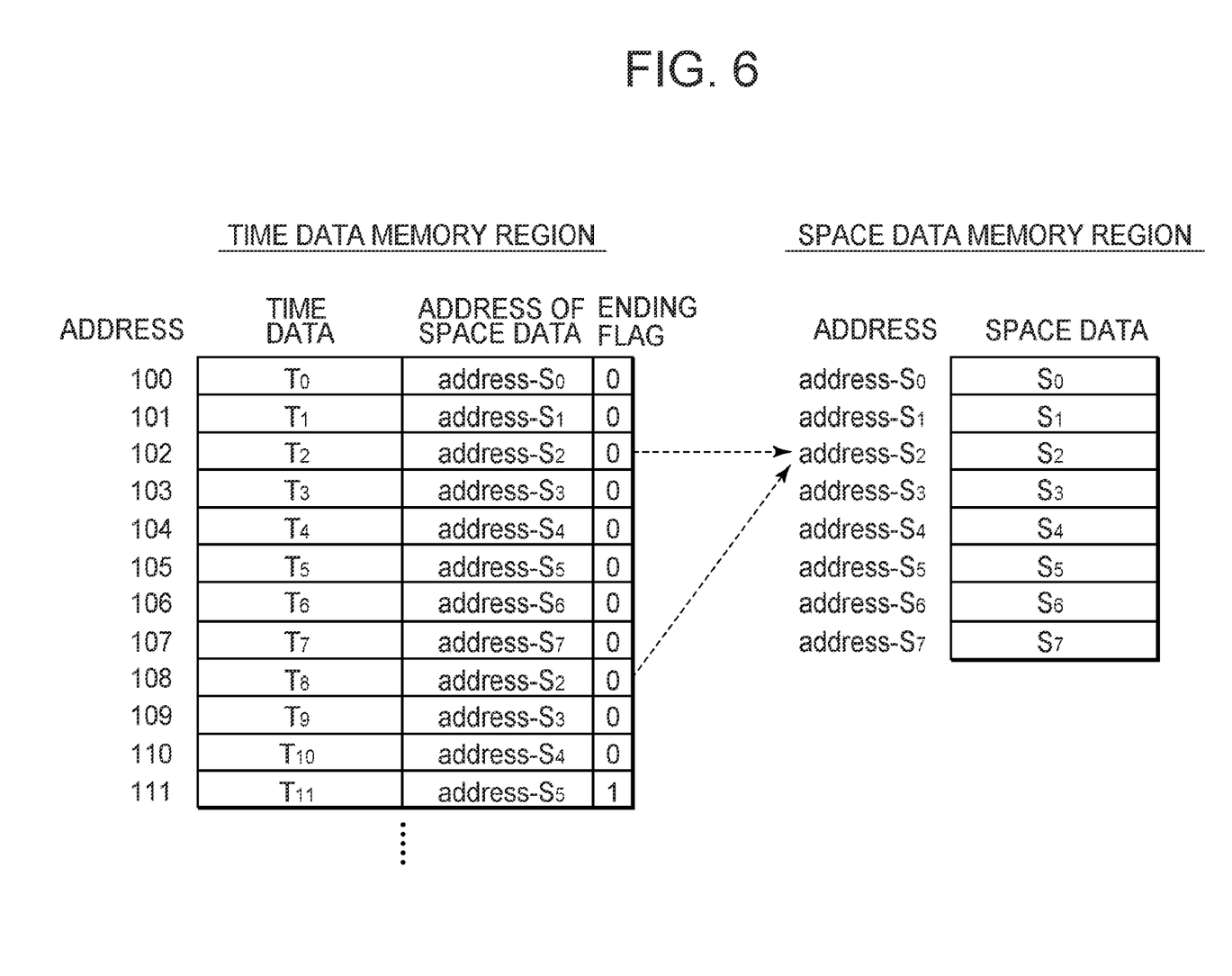
FIG. 6 is a diagram showing the application example of the data to be stored in the main memory of the example of the signal generator to which the present invention is applied.

In addition, in a case where the space data are duplicated as the drive timing pulses shown in FIG. 4, namely when the space data at the time data T2 and T8 are the same, the space data at the time data T3 and T9 are the same, the space data at the time data T4 and T10 are the same, and the space data at the time data T5 and T11 are the same, the same space data is not stored to both of the time data at which the spade data is duplicated (see FIG. 5), but a memory region for the space data is previously prepared besides the memory region for the time data to specify the addresses in the memory region for the space data in stead of storing the space data (see FIG. 6). As a result, the redundancy of the space data can be reduced, and the miniaturization of the memory region that has to be secured is realized.

In the following, a case where the drive timing pulses shown in FIG. 2 are generated by the TG mentioned above will be described as an example.

In a case where the drive timing pulses shown in FIG. 2 are generated, the control circuit 7 specifies the mode A to the main memory 6, and thereby reads the time data T0-T11 of the mode A from the main memory 6 into the n bit register 2 to make the n bit register 2 store the read time data T0-T11.

At the same time, the control circuit 7 specifies the address (100), which is the starting address of the mode A, and thereby the control circuit 7 reads the space data at the time data T0 from the main memory 6 to each of the one bit registers to make each of the one bit registers store the read space data. In concrete terms, the control circuit 7 makes the one bit register SETRST_1 store data "0", makes the one bit register SETRST_2 store data "1", makes the one bit register SETRST_3 store data "1", makes the one bit register SETRST_4 store data "1", makes the one bit register SETRST_5 store data "1", makes the one bit register SETRST_6 store data "1", makes the one bit register SETRST_7 store data "0", and makes the one bit register SETRST_8 store data "0."

When the reading of the data to the n bit register 2 and each of the one bit registers has ended, the counting of the n bit counter 1 is started. In addition, in the initial state in this case, V1-V4 are made to be the H level, and V5-V8 are made to be the L level.

Now, when the counting of the n bit counter 1 has advanced and the counted value of the n bit counter 1 reaches the time data T0, the comparator 3 issues the timing signal.

Each of the output signal control means 4 that have received the timing signal issued from the comparator 3 controls the drive timing pulses to the state of being stored in the one bit registers. In concrete terms, the output signal control means 4 controls so that the state of V1 may change from the H level to the L level, the state of V5 may change from the L level to the H level, and the state of V6 may change from the L level to the H level. By the control of the output signal control means 4, the state changes of the drive timing pulses at the time data T0 can be realized.

Moreover, the control circuit 7, which has received the timing signal issued from the comparator 3 specifies an address (101) succeeding to the present address (100), and thereby the control circuit 7 reads the space data at the time data T1 from the main memory 6 to store the data in each of the one bit registers by overwriting the read space data onto the previous data. In concrete terms, the control circuit 7 makes the one bit register SETRST_1 store data "0", makes the one bit register SETRST_2 store data "0", makes the one bit register SETRST_3 store data "1", makes the one bit register SETRST_4 store data "1", makes the one bit register SETRST_5 store data "1", makes the one bit register SETRST_6 store data "1", makes the one bit register SETRST_7 store data "0", and makes the one bit register SETRST_8 store data "0."

Successively, when the counting of the n bit counter 1 has advanced and the counted value of the n bit counter 1 reaches the time data T1, the timing signal is issued from the comparator 3, and the similar processing to that at the time when the counted value of the n bit counter 1 reaches the time data T0 is performed.

The processing mentioned above is repeated until the ending flag bit changes to data "1", in concrete terms, by repeating the processing until the time data T11, the drive timing pulses shown in FIG. 2 can be obtained.

The aforesaid signal generator to which the present invention is applied realizes the reduction of the circuit scale.

That is, the related art signal generator has been configured to be provided with n bit registers to each changing point of drive timing pulses and n bit comparison circuits CMP to each of the n bit registers to compare the counted value of the counter 103 with the data indicating the rise or the fall of each of the drive timing pulses to each changing point of the drive timing pulses. On the other hand, because the signal generator to which the present invention is applied needs only one n bit comparison circuit that compares the counter output of the n bit counter 1 with the data indicating the rises or the falls of each of the drive timing pulses, the circuit scale can be reduced.

Moreover, the signal generator to which the present invention is applied can reduce the capacity of the built-in memory and the amount of the data to be transmitted to the memory.

That is, the related art signal generator includes the data of a rise position and a fall position to each changing point of a drive timing pulse. On the other hand, the signal generator to which the present invention is applied adopts the technique of including the data of the state of each drive timing pulse at every time when the state of the drive timing pulse changes. Consequently, the amount of the data to be stored in the memory in a case where the change positions of drive timing pulses duplicate with each other can be reduced to make it possible to reduce the data capacity of the built-in memory and the amount of the data to be transmitted to the memory. It is noted that the drive timing pulses for driving a CCD includes a plurality of rises and falls, and these rises and falls relate to the transfer, such as V transfer, H transfer, and reset gate RG at the output unit, of the signal charges of the CCD. In order to perform the transfer without any accidents practically, the order of the transfer such as V1->V2, the application time of electric potential, and the like are inevitably determined by the structure of the CCD. Consequently, transfer patterns, that is, the combinations of the H level and the L level in a certain time width, are limited, namely many change positions of space data duplicate with each other, and the space data frequently becomes relatively small data in practice. Accordingly, it is conceivable that the reduction effect of the capacity of the built-in memory and the amount of the data to be transferred to the memory according to the present invention is very large.

Moreover, even in a case where the drive timing pulses generated by the signal generator are complicated and a great deal of data of rise positions and fall positions are necessary and furthermore the regularity of the data is little, it is possible to produce wider kinds of drive timing pulses by the signal generator to which the present invention is applied because the signal generator can set rise positions and fall positions in one mode as long as the capacity of the memory to be mounted permits.

Thereby, because the signal generator to which the present invention is applied can greatly reduce the capacity of the built-in memory and the number of the n bit comparison circuits in comparison with the related art signal generator, the reduction of manufacturing costs and the decrease of power consumption are realized as a result.

Furthermore, the reduction of the n bit comparison circuits also contributes to the decrease of the load capacity of the output of the counter, which is always operating, and the decrease of the power consumption is also realized.

A signal generator to which the present invention is applied can realize the reduction of the circuit scale thereof, and can increase the degree of freedom of the signals that can be generated.

It should be understood by those skilled in the art that various modifications, combinations, sub-combinations and alterations may occur depending on design requirements and other factors insofar as they are within the scope of the appended claims or the equivalents thereof.

What is claimed is:

1. A signal generator comprising:
    a main memory which stores at least time data indicating timing when a state change of a timing pulse occurs and space data indicating a state of the timing pulse corresponding to the time data;
    a counter which counts a clock to be a reference;
    a first memory connected to the main memory to store predetermined time data in time data stored in the main memory;
    a comparator connected to the counter and the first memory to compare an output of the counter with the predetermined time data stored in the first memory and to output a result;
    a second memory connected to the main memory to store predetermined space data in space data stored in the main memory; and
    output signal control means connected to the comparator and the second memory, which controls the timing pulse to a state of the timing pulse indicated by the space data stored in the second memory on the basis of an output of the comparator.

2. The signal generator according to claim 1, wherein the main memory is a random access memory.

3. The signal generator according to claim 1, wherein the first memory is composed of an n bit register (n is an integer equal to or more than 1), and the second memory is composed of x (x is an integer equal to or more than 1) one bit registers.

4. The signal generator according to claim 1, wherein the second memory performs control of the timing pulse using an output that has departed from the comparator first as a trigger, and after that the second memory stores space data pertaining to the control of the timing pulse using an output that has departed later from the comparator as a trigger.

5. A signal generator comprising:
    a main memory which stores at least time data indicating timing when a state change of a timing pulse occurs and space data indicating a state of the timing pulse corresponding to the time data;
    a counter which counts a clock to be a reference;
    a first memory connected to the main memory to store predetermined time data in time data stored in the main memory;

a comparator connected to the counter and the first memory to compare an output of the counter with the predetermined time data stored in the first memory and to output a result;

a second memory connected to the main memory to store predetermined space data in space data stored in the main memory; and an output signal controller connected to the comparator and the second memory, which controls the timing pulse to a state of the timing pulse indicated by the space data stored in the second memory on the basis of an output of the comparator.

* * * * *